(12) United States Patent
Hosking et al.

(10) Patent No.: US 9,912,404 B2
(45) Date of Patent: Mar. 6, 2018

(54) ELECTROMAGNETIC POWER MEASUREMENT AND REPORTING

(71) Applicant: Finisar Corporation, Sunnyvale, CA (US)

(72) Inventors: Lucy G. Hosking, Santa Cruz, CA (US); Andrew Zocher, Monticello, IL (US); Theron Jones, White Heath, IL (US)

(73) Assignee: Finisar Corporation, Sunnyvale, CA (US)

( * ) Notice: Subject to any disclaimer, the term of this patent is extended or adjusted under 35 U.S.C. 154(b) by 102 days.

(21) Appl. No.: 14/997,163

(22) Filed: Jan. 15, 2016

(65) Prior Publication Data

US 2016/0211911 A1 Jul. 21, 2016

Related U.S. Application Data

(60) Provisional application No. 62/106,114, filed on Jan. 21, 2015.

(51) Int. Cl.
*H04B 17/00* (2015.01)
*H04B 10/079* (2013.01)
*G01R 29/08* (2006.01)

(52) U.S. Cl.
CPC ... *H04B 10/07955* (2013.01); *G01R 29/0892* (2013.01)

(58) Field of Classification Search
CPC ........... H04B 10/07955; G01R 29/0892; H04J 14/0221
See application file for complete search history.

(56) References Cited

U.S. PATENT DOCUMENTS

| | | | | |
|---|---|---|---|---|
| 6,069,565 A | * | 5/2000 | Stern | B64D 15/20 340/583 |
| 2004/0135992 A1 | * | 7/2004 | Munro | G01S 17/10 356/4.01 |
| 2013/0135606 A1 | * | 5/2013 | Giacotto | G01C 3/08 356/5.01 |
| 2015/0276699 A1 | * | 10/2015 | Katayama | G21D 1/02 250/361 R |

* cited by examiner

*Primary Examiner* — Tesfaldet Bocure
(74) *Attorney, Agent, or Firm* — Maschoff Brennan (57) ABSTRACT

A method to measure and report electromagnetic radiation power includes receiving electromagnetic radiation and generating an electrical signal in response to the received electromagnetic radiation. The electrical signal may have a magnitude based on the power of the electromagnetic radiation. The method also includes applying a logarithmic gain to the electrical signal to generate a logarithmically amplified electrical signal. The method also includes sampling the logarithmically amplified electrical signal to generate a digital sample of the logarithmically amplified electrical signal.

20 Claims, 5 Drawing Sheets

ELECTROMAGNETIC POWER MEASUREMENT AND REPORTING

CROSS-REFERENCE TO RELATED APPLICATION

This application claims the benefit of and priority to U.S. Provisional App. No. 62/106,114, filed Jan. 21, 2015, which application is incorporated herein by reference.

FIELD

The embodiments discussed herein are related to electromagnetic power measurement and reporting.

BACKGROUND

In communication systems, light beams are increasingly used for transmitting information. The demand for communication bandwidth has resulted in a conversion of long and short haul communication trunk lines from copper to fiber optic (digital) communication. The wide spectral characteristics of fiber optics support broadband signals at very high data rates, e.g., gigabits per second.

Generally, a fiber optic transmitter converts an electrical signal to a modulated light beam, which is then passed through an optical fiber to a fiber optic receiver that extracts an electrical signal from the received light beam. An optical fiber may be shared with different communication channels using frequency (or wavelength), time, space, or other forms of multiplexing. A typical optical link extends the range of a communication system with a fiber optic transceiver unit that handles optoelectronic conversion between optical fibers and local area networks (LAN) on opposing ends of the fiber. Typical fiber optic transceivers include both a Receiver Optical Subassembly (ROSA) to receive light signals and a Transmitter Optical Subassembly (TOSA) to transmit light signals. Fiber optic transceivers offer gigabit communication rates over long haul trans-oceanic cables or short range links in a metropolitan area.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

In general, the embodiments discussed herein are related to electromagnetic power measurement and reporting.

In an example embodiment, a method to measure and report electromagnetic radiation power includes receiving electromagnetic radiation and generating an electrical signal in response to the received electromagnetic radiation. The electrical signal may have a magnitude based on the power of the electromagnetic radiation. The method also includes applying a logarithmic gain to the electrical signal to generate a logarithmically amplified electrical signal. The method also includes sampling the logarithmically amplified electrical signal to generate a digital sample of the logarithmically amplified electrical signal.

In another example embodiment, a system includes a photodiode, a circuit, a logarithmic amplifier, and an analog-to-digital converter (ADC). The photodiode may be configured to receive electromagnetic radiation and generate a first electrical signal in response to the received electromagnetic radiation. A magnitude of the first electrical signal may be based on a power of the electromagnetic radiation. The circuit may be electrically coupled to the photodiode and may be configured to generate a second electrical signal based on the magnitude of the first electrical signal. The logarithmic amplifier may be electrically coupled to the circuit and may be configured to apply a logarithmic gain to the second electrical signal to generate a logarithmically amplified electrical signal. The ADC may be electrically coupled to the logarithmic amplifier and may be configured to sample the logarithmically amplified signal and generate a digital sample.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter. Moreover, it is to be understood that both the foregoing general description and the following detailed description of the present invention are exemplary and explanatory and are intended to provide further explanation of the invention as claimed.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

This disclosure is generally drawn, inter alia, to methods, apparatus, systems, devices, and computer program products that generally relate to improved measurement and reporting of electromagnetic radiation power.

As an example, the systems and methods described herein may utilize logarithmic amplifiers to achieve improved resolution of electromagnetic radiation power measurements over a wide dynamic range of input power and eliminate the need to perform complex computations compared to some other amplifiers. The logarithmic amplifiers utilized herein may also reduce circuit complexity, firmware complexity, dynamic control system complexity, and calibration system complexity compared to some other amplifiers.

A particular method described herein provides an improved scale for formatting and reporting electromagnetic power measurements compared to some other methods. This improved method and scale provides electromagnetic radiation power measurements over a wider dynamic range of input power compared to some other methods.

Most fiber optic receivers are capable of measuring the power of electromagnetic radiation (e.g., light signals) they receive from optical transmitters. For example, these receivers may have sufficient resolution and accuracy when measuring the power of relatively strong/intense light signals near a top end of their input power capabilities. However, the resolution and accuracy of these measurements is only good over a relatively small dynamic range of input power (e.g., 10 to 15 dB) near the top end of their input power capabilities. These receivers lack the resolution and accuracy to measure the power of weaker, or less intense, light signals that fall within the middle and lower ranges of their input power capabilities. This limited power measurement capability may be sufficient and economical for many fiber optic systems. However, some fiber optic systems require receivers with better power measurement capabilities including increased resolution and accuracy over a wider dynamic range of power input. For example, high performance fiber optic receivers have the ability to sense strong and weak light signals over a very wide dynamic range of input power (e.g., 20 to 30 dB).

Generally, photodiodes interact with electromagnetic radiation to create photocurrents that may indicate the power or intensity of the electromagnetic radiation received by the photodiodes. In this manner, generated photocurrents may be used to calculate the power of electromagnetic radiation. Some generated photocurrents may not be directly measured. Rather, a mirrored current of the generated photocurrents (generated by current mirror circuits) may be measured to indirectly measure the generated photocurrents. In these and other circumstances, the current mirror circuits may create isolated mirror currents that are relatively proportional to the photocurrents generated by the photodiode.

Figure 1:
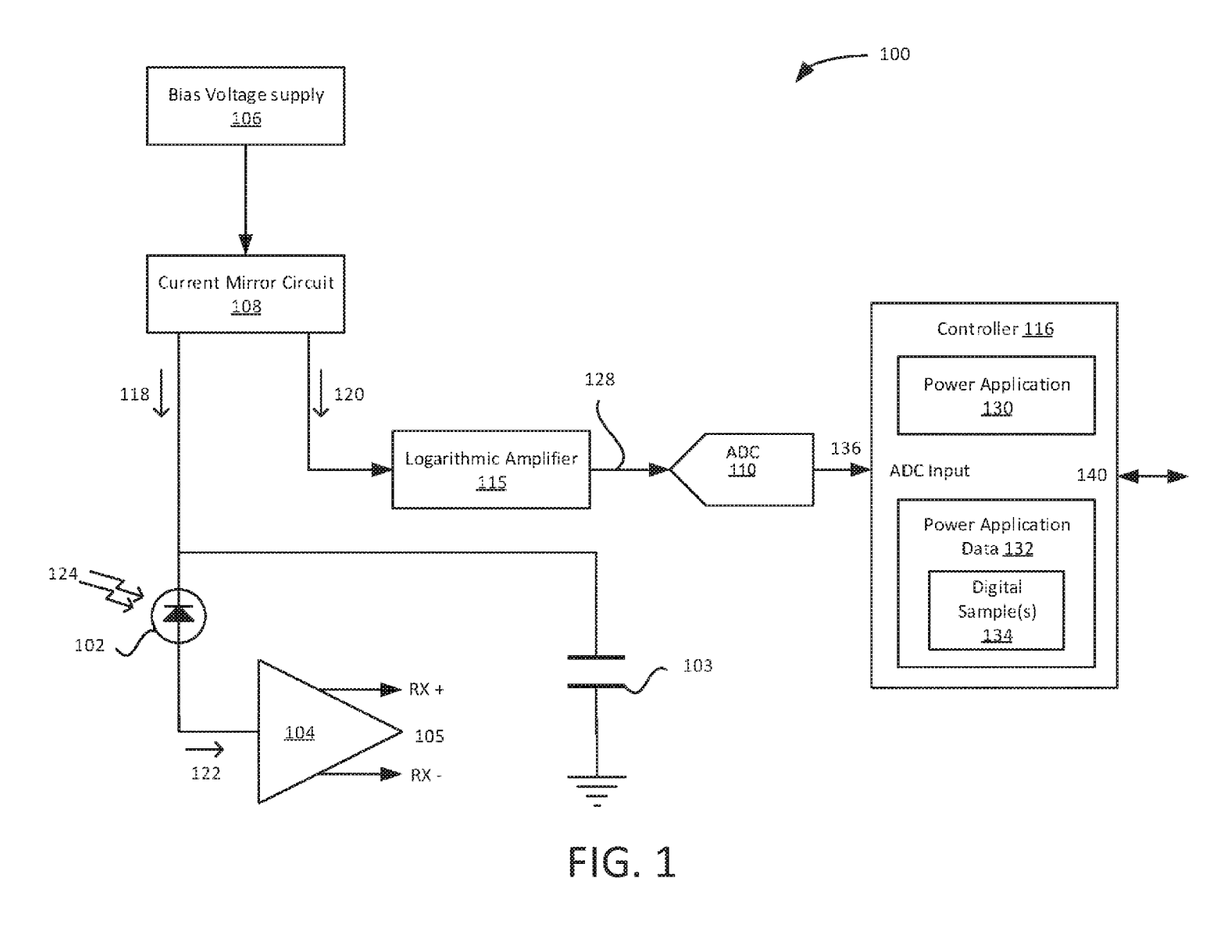
FIG. 1 illustrates an example electromagnetic radiation power measurement and reporting circuit.

FIG. 1 illustrates an example electromagnetic radiation power measurement and reporting circuit 100 ("the circuit 100"), arranged in accordance with at least some embodiments disclosed herein. The circuit 100 may include, but is not limited to, a photodiode 102, a capacitor 103, a photocurrent amplifier 104, a bias voltage supply 106, a current mirror circuit 108, an analog-to-digital converter (ADC) 110, a logarithmic amplifier 115, and a controller 116. The components of the circuit 100 may be communicatively coupled to each other as illustrated in FIG. 1. The photodiode 102 may be coupled to the input of the photocurrent amplifier 104. The current mirror may be coupled to the cathode of the photodiode 102, the capacitor 103, and the logarithmic amplifier 115. The bias voltage supply 106 may be coupled to the current mirror circuit 108. The logarithmic amplifier 115 may be coupled to the ADC 110, and the ADC may be coupled to the controller 116. The controller 116 may include a power application 130 and power application data 132, such as digital samples 134.

The components of the circuit 100 may be integrated together on a single semiconductor substrate (not shown). Alternately or additionally, one or more of the components of the circuit 100 may remain separate from other circuitry components. In some embodiments, the circuit 100 may be located within a single housing, such as a ROSA housing or other fiber optic transceiver housing (not shown).

In some embodiments, the photocurrent 122 may include an electrical signal generated by the photodiode 102 that may be amplified by the photocurrent amplifier 104. In some embodiments, the photocurrent amplifier 104 may include a transimpedance amplifier (TIA) configured to amplify and convert the generated photocurrent 122 to a voltage, or any other suitable amplifier configured to amplify the generated photocurrent 122. The photocurrent amplifier 104 may amplify the generated photocurrent 122 and output data representing the generated photocurrent 122 on output pins RX+ and RX− 105. The data may be further amplified by a post-amplifier (not shown) and/or communicated to outside circuitry (not shown).

The photodiode 102 may include a P-N photodiode, a PIN photodiode, an avalanche photodiode, or any other suitable photodiode. In some embodiments, the bias voltage supply 106 may be configured to apply a reverse-bias voltage to the photodiode 102. Generally, if the reverse-bias voltage applied to an avalanche photodiode is increased, an avalanche breakdown will eventually occur at a characteristic avalanche voltage $V_A$. The avalanche voltage $V_A$ may range from about 40 volts to about 200 volts and may vary from one avalanche photodiode to another. The avalanche voltage $V_A$ may also vary as a function of the temperature of the avalanche photodiode. Generally, the sensitivity of an avalanche photodiode may be maximized when it is operated at a reverse-bias voltage $V_{APD}$ that is a little less than the avalanche voltage $V_A$. In some embodiments, the avalanche voltage $V_A$ may be about 1 volt or less.

The current mirror circuit 108 may be coupled between the bias voltage supply 106 and the photodiode 102. The current mirror circuit 108 may be configured to pass an average reverse-bias current to the photodiode 102 and to produce a mirror current 120. The mirror current 120 may be provided as an input to the logarithmic amplifier 115. The mirror current 120 may be proportional to the average reverse-bias current. The photocurrent 122 generated by the photodiode 102 may be proportional to the power of the electromagnetic radiation 124 and may vary with time. The capacitor 103 may serve to filter the high-speed time-varying photocurrent 122 to generate an average DC photocurrent 118. The average DC photocurrent 118 may be useful for out-of-band signals that are modulated at low frequencies, near DC. Thus, the mirror current 120 may also vary in time in proportion to the average power of the electromagnetic radiation 124.

In some embodiments, the current mirror circuit 108 may generate the mirror current 120 approximately proportional to the generated average DC photocurrent 118 without regard to a load placed on an output of the current mirror circuit 108. For example, if the generated average DC photocurrent 118 increases, the current mirror circuit 108 may proportionally increase the mirror current 120, regardless of a size of the load on the output of the current mirror circuit 108. Likewise, if the generated average DC photocurrent 118 decreases, the current mirror circuit 108 may proportionally decrease the mirror current 120, regardless of the size of the load on the output of the current mirror circuit 108.

In some embodiments, the output of the current mirror circuit 108 that outputs the mirror current 120 may be coupled to and loaded by the logarithmic amplifier 115. The logarithmic amplifier 115 may be configured to adjust a voltage on a sample node 128 based on a magnitude of the mirror current 120 and a logarithmic gain of the logarithmic amplifier 115. The magnitude of the voltage at the sample node 128 may represent the average power of the electromagnetic radiation 124 received by the photodiode 102, which may vary based on the average power of the electromagnetic radiation 124. The voltage at the sample node 128 may be sampled by the ADC 110 to measure the average power of the electromagnetic radiation 124 received by the photodiode 102.

In some embodiments, the gain of the logarithmic amplifier 115 may be fixed. In these and other embodiments, as the magnitude of the mirror current 120 increases, the voltage at the sample node 128 may also increase logarithmically with the magnitude of the mirror current 120. In at least some embodiments, the gain of the logarithmic amplifier 115 may have a slope ranging from about twenty-four millivolts per dB to about twenty-seven millivolts per dB. However, other logarithmic gains with different slopes may be implemented without departing from the spirit or scope of the present disclosure. Accordingly, the power of the electromagnetic radiation 124 may be naturally computed and expressed in dB or dBm by the logarithmic amplifier 115, thereby eliminating the need to compute the power of the electromagnetic radiation 124 in dB or dBm using a log function in firmware. Thus, the logarithmic amplifier 115 may reduce circuit complexity, firmware complexity, dynamic control system complexity, and calibration system complexity.

The analog-to-digital converter (ADC) 110 may be coupled to the sample node 128 and may be configured to sample the voltage at the sample node 128. The ADC 110 may convert the analog voltage at the sample node 128 into one or more digital samples 134 with digital values. The digital samples 134 may be sent to the controller 116 for additional calibration and/or storage in predefined memory locations, as will be discussed in more detail below. In at least some embodiments, the ADC 110 may be controlled by a clock signal (not shown) to periodically sample the voltage at the sample node 128. The ADC 110 may also include an automatic prescaler (not shown), or other electronic circuitry to reduce high amplitude signals to a lower amplitude to be more acceptable to the ADC 110, or likewise to increase low amplitude signals to a higher amplitude to be more acceptable to the ADC 110.

In some embodiments, the ADC 110 may have a 10-bit resolution. However, ADC's with other resolution levels may also be used in other embodiments without departing from the spirit or scope of the present disclosure. The dynamic range of electromagnetic radiation power measurements may be limited by the resolution of the ADC 110. For example, a 10-bit ADC has 1024 counts (ranging from count 0 to count 1023). Typically, the maximum overall gain value of an amplifier may be selected so that the expected maximum generated average DC photocurrent 118 does not cause the mirror current 120 (and thereby the voltage at sample node 128 resulting from the generated average DC photocurrent 118) to overload the ADC 110. For example, if the ADC 110 overload occurs at about 2 mW ($\approx$+3 dBm), then the ADC 110 will be near its maximum at approximately 1023 counts. At $-$7 dBm (10 dB below +3 dBm), the ADC 110 will be at approximately 102 counts, which represents $\approx$1% resolution per count. At $-$17 dBm (20 dB below +3 dBm), the ADC 110 will be at approximately 10 counts, and the resolution will deteriorate to $\approx$10% per count. Accordingly, in this example the theoretical useful dynamic range of electromagnetic radiation power measurements utilizing a 10-bit ADC is about 20 dB. Moreover, non-linearity introduced by the photodiode 102, the current mirror circuit 108, the ADC 110, and/or other circuit components may further limit the useful dynamic range of electromagnetic radiation power measurements to a practical range of about 15 dB near the upper range of electromagnetic radiation power measurements.

A logarithmic amplifier, such as the one shown in FIG. 1, may be implemented to compensate for the reduced resolution and dynamic range caused by the ADC 110, thereby achieving a high-resolution power measurement system over a wide dynamic range. The logarithmic amplifier 115 may be configured to compress the dynamic range of the power of the electromagnetic signal 124 (e.g., 40 dB) to fit within a particular resolution zone of the ADC 110, as will be discussed in more detail below. Moreover, the resolution at the bottom end of the dynamic range may be equal to the resolution at the top end of the dynamic range and the resolution may be sufficient at low power levels to yield accurate power measurements. The logarithmic amplifier 115 may also be located at or near the generated photocurrent 122 in order to preserve the signal-to-noise ratio of the generated photocurrent 122.

The controller 116 may be configured to receive digital samples 134 from the ADC 110 at an ADC input 136. The controller 116 may include a power application 130 configured to calculate power measurements based on the digital samples 134. The power application 130 may also calibrate the digital samples 134 to standard units (e.g., millivolts, microwatts, or dBm) and/or store the digital samples 134 in predefined memory locations, as will be discussed in more detail below. The power application 130 may also communicate the power measurements through a communication interface 140, such as an I$^2$C interface, or any other suitable interface.

Figure 2:
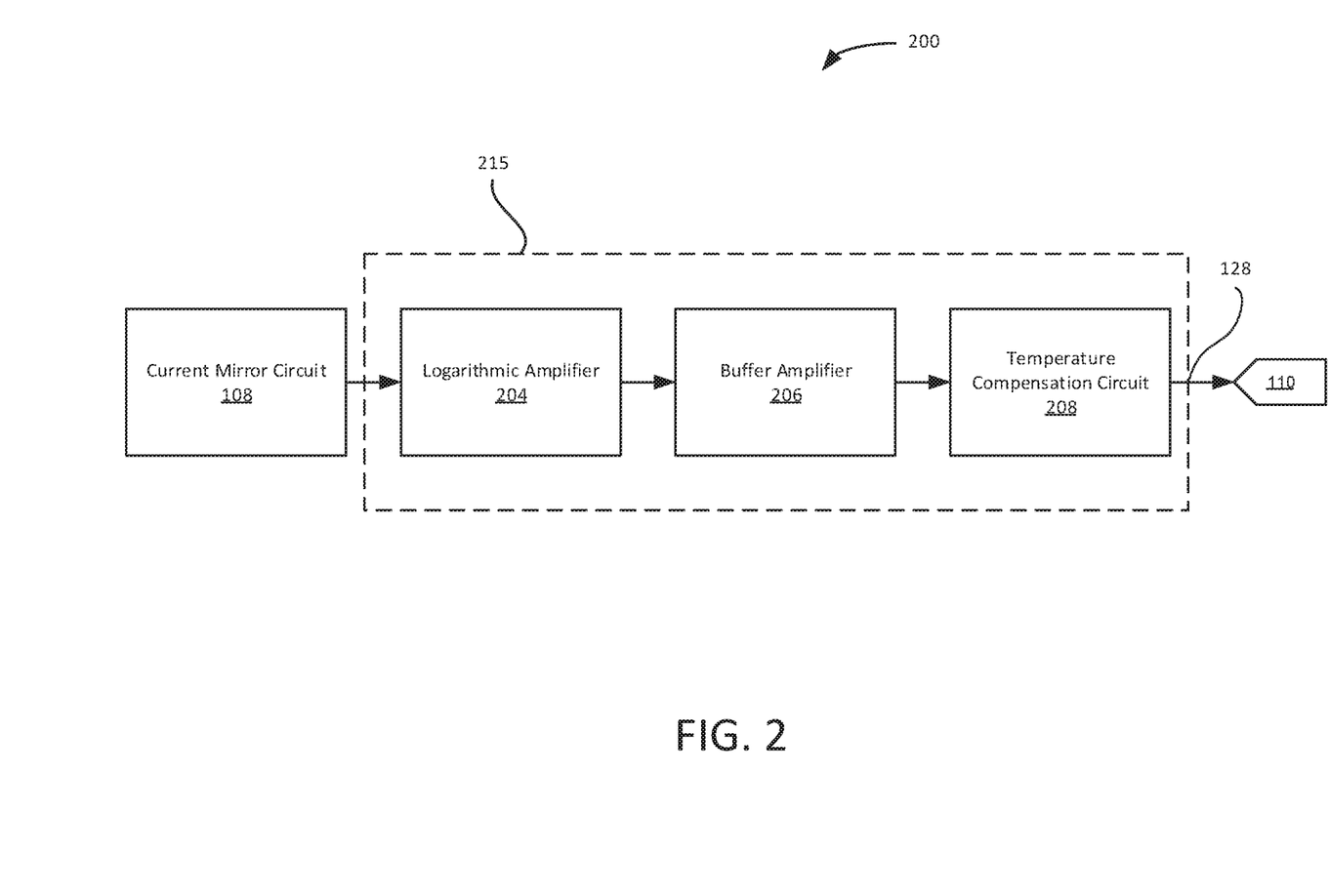
FIG. 2 is a block diagram illustrating a portion of the circuit of FIG. 1 including an example logarithmic amplifier circuit.

FIG. 2 is a block diagram illustrating a circuit 200 that may be implemented in the circuit 100 of FIG. 1, arranged in accordance with at least one embodiment described herein. The circuit 200 may include the current mirror circuit 108 and the ADC 110 of FIG. 1. The current mirror circuit 108 may be connected to an example logarithmic amplifier circuit 215 and the ADC 110 may be connected to the example logarithmic amplifier circuit 215 at the sample node 128. In at least some embodiments, the example logarithmic amplifier circuit 215 may correspond to the logarithmic amplifier 115 of FIG. 1. The example logarithmic amplifier circuit 215 may include a logarithmic amplifier 204, a buffer amplifier 206, and a temperature compensation circuit 208. The components of the circuit 200 may be communicatively coupled to each other as illustrated in FIG. 2.

Figure 3:
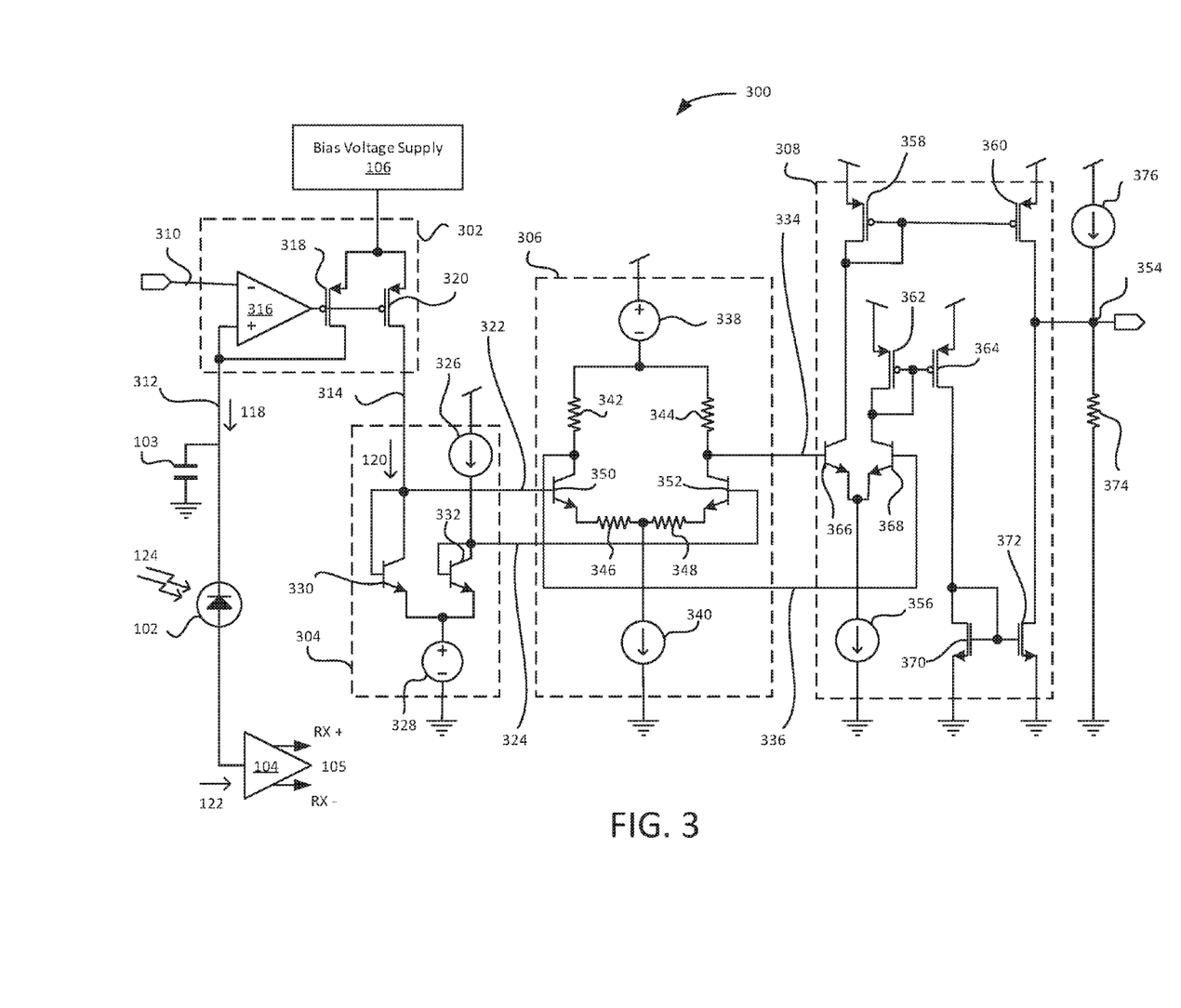
FIG. 3 illustrates one embodiment of the example logarithmic amplifier circuit of FIG. 2.

FIG. 3 illustrates an example circuit 300 that may correspond to the circuit 200 of FIG. 2, arranged in accordance with at least one embodiment described herein. The circuit 300 may include a current mirror circuit 302, a logarithmic amplifier 304, a buffer amplifier 306, and a temperature compensation circuit 308. The current mirror circuit 302 may correspond to the current mirror circuit 108 of FIGS. 1 and 2. The logarithmic amplifier 304 may correspond to the logarithmic amplifier 204 of FIG. 2. The buffer amplifier 306 may correspond to the buffer amplifier 206 of FIG. 2 and the temperature compensation circuit 308 may correspond to the temperature compensation circuit 208 of FIG. 2. The example circuit 300 of FIG. 3 also illustrates various components and signals from FIG. 1 for general reference with respect to other components of the example circuit 300. For example, FIG. 3 illustrates the photodiode 102, the capacitor 103, the bias voltage supply 106, the average DC photocurrent 118, the mirror current 120, the generated photocurrent 122, and the electromagnetic radiation 124 of FIG. 1.

In at least one embodiment, the current mirror circuit 302 may include a precision current mirror circuit. The current mirror circuit 302 may include a first input terminal 310, a second output terminal 312, a third output terminal 314, an operational amplifier 316, and first and second transistors 318, 320. The first and second transistors 318, 320 may include metal-oxide-semiconductor field-effect (MOSFET) transistors or other suitable transistors. In general, each of the MOSFET transistors in FIG. 3 may include a gate terminal, a source terminal, and a drain terminal. As illustrated in FIG. 3, the source terminal may be the terminal with the arrow, the gate terminal may be the terminal with the parallel vertical lines, and the drain terminal may be the other terminal.

A desired voltage may be applied to the first input terminal 310 to set the cathode voltage of the photodiode 102. The second output terminal 312 may be coupled to the cathode of the photodiode 102 and the third output terminal 314 may be coupled to the logarithmic amplifier 304. Source terminals of each of the first and second transistors 318, 320 may be coupled to the bias voltage supply 106. Drain terminals of the first and second transistors 318, 320 may be coupled to the second output terminal 312 and the third output terminal 314, respectively. Gate terminals of the first and second transistors 318, 320 may be coupled together and coupled to an output terminal of the operational amplifier 316. An inverting input of the operational amplifier 316 may be coupled to the first input terminal 310 and a non-inverting input of the operation amplifier 316 may be coupled to the second output terminal 312.

The current mirror circuit 302 may be configured to pass an average reverse-bias current to the photodiode 102 and to produce the mirror current 120. The mirror current 120 may be provided as an input to the logarithmic amplifier 304. The mirror current 120 may be proportional to the average reverse-bias current. The photocurrent 122 generated by the photodiode 102 may be proportional to the power of the electromagnetic radiation 124 and may vary with time. The capacitor 103 may filter the high-speed time-varying AC photocurrent 122 in order to generate an average DC photocurrent 118. The average DC photocurrent 118 may be useful for out-of-band signals that are modulated at low frequencies, near DC. Thus, the mirror current 120 may also vary in time in proportion to the average power of the electromagnetic radiation 124.

In some embodiments, the current mirror circuit 302 may generate the mirror current 120 approximately proportional to the average DC photocurrent 118 without regard to a load placed on the third output terminal 314 of the current mirror circuit 302 by the logarithmic amplifier 304. For example, if the average DC photocurrent 118 increases, the current mirror circuit 302 may proportionally increase the mirror current 120, regardless of a size of the load placed on the third output terminal 314 by the logarithmic amplifier 304. Likewise, if the average DC photocurrent 118 decreases, the current mirror circuit 302 may proportionally decrease the mirror current 120, regardless of the size of the load placed on the third output terminal 314 by the logarithmic amplifier 304.

The logarithmic amplifier 304 may include fourth and fifth output terminals 322, 324, a first current source 326, a first voltage source 328, and third and fourth transistors 330, 332. The third and fourth transistors 330, 332 may include bipolar junction transistors (BJTs) or other suitable transistors. In general, each of the BJTs illustrated in FIG. 3 may include an emitter terminal, a base terminal, and a collector terminal. As illustrated in FIG. 3, the emitter terminal may be the terminal with the arrow, the base terminal may be the terminal perpendicular to the single vertical line, and the collector terminal may be the other terminal.

The fourth and fifth output terminals 322, 324 of the logarithmic amplifier 304 may be coupled to the buffer amplifier 306. The emitter terminals of the third and fourth transistors 330, 332 may be coupled to the first voltage source 328 and the first voltage source 328 may be coupled to ground. The base and collector terminals of the third transistor 330 may both be coupled to the third output terminal 314 and the fourth output terminal 322. The base and collector terminals of the fourth transistor 332 may both be coupled to the first current source 326 and the fifth output terminal 324. The first current source 326 may also be coupled to a voltage supply (not shown).

The logarithmic amplifier 304 may be configured to logarithmically amplify the mirror current 120 and to provide a logarithmically amplified voltage on the fourth output terminal 322. The first current source 326 may be substantially constant and may be configured to activate the fourth transistor 332 to create a reference voltage on the fifth output terminal 324. The logarithmically amplified voltage on the fourth output terminal 322 and the reference voltage on the fifth output terminal 324 may be inputs to the buffer amplifier 306. The difference in voltage between the fourth and fifth output terminals 322, 324 may be a logarithmic representation of the current ratios between the mirror current 120 and the first current source 326 and/or may be a logarithmic representation of the areas of the third and fourth transistors 330, 332. The collector current $I_C$ of a typical BJT may be approximately equal to a saturation current $I_S$ times a natural exponent of the ratio of a base-emitter voltage $V_{BE}$ and a thermal voltage $V_T$, which may be expressed as: $I_C=I_Se^{(V_{BE}/V_T)}$. The third and fourth transistors 330, 332 may be arranged in close proximity to each other such that their temperatures may be the same, or similar to each other, and their saturation currents may be proportional to their respective areas. In some embodiments, the thermal voltage may be proportional to an absolute temperature and the gain of the logarithmic amplifier 304 may also be proportional to the absolute temperature.

In some embodiments, the gain of the logarithmic amplifier 304 may be fixed. In these and other embodiments, as the magnitude of the mirror current 120 increases, the voltage at the fourth output terminal 322 may also increase logarithmically with the magnitude of the mirror current 120. In at least some embodiments, the gain of the logarithmic amplifier 304 may be measured in units of millivolts per dB. Accordingly, the power of the electromagnetic radiation 124 may be naturally computed in dB or dBm by the logarithmic amplifier 304, thereby eliminating the need to compute the power of the electromagnetic radiation 124 in dB or dBm using a log function in firmware.

In at least one embodiment, the buffer amplifier 306 may include a differential amplifier. The buffer amplifier 306 may include sixth and seventh output terminals 334, 336, a second voltage source 338, a second current source 340, first, second, third, and fourth resistors 342, 344, 346, 348, and fifth and sixth transistors 350, 352.

The sixth and seventh output terminals 334, 336 of the buffer amplifier 306 may be respectively coupled between collector terminals of the fifth and sixth transistors 350, 352 and the temperature compensation circuit 308. The first resistor 342 may be coupled between the collector terminal of the fifth transistor 350 and the second voltage source 338. The second resistor 344 may be coupled between the collector terminal of the sixth transistor 352 and the second voltage source 338. The second voltage source 338 may be also coupled to a voltage supply (not shown). The third resistor 346 may be coupled between an emitter terminal of the fifth transistor 350 and the second current source 340. The fourth resistor 348 may be coupled between the emitter terminal of the sixth transistor 352 and the second current source 340. The second current source 340 may also be coupled to ground. A base terminal of the fifth transistor 350 may be coupled to the fourth output terminal 322 and a base terminal of the sixth transistor 352 may be coupled to the fifth output terminal 324.

The buffer amplifier 306 may be configured to buffer and/or amplify the logarithmically amplified voltage presented on the fourth output terminal 322 with respect to the reference voltage presented on the fifth output terminal 324. The buffer amplifier 306 may output a buffered logarithmically amplified voltage on the sixth and seventh output terminals 334, 336. A gain of the buffer amplifier 306 may be determined by resistor values of the first, second, third, and fourth resistors 342, 344, 346, 348. For example, the resistor values of the first, second, third, and fourth resistors 342, 344, 346, 348 may be selected to achieve a fractional gain (e.g., less than 1). This may avoid overdriving the temperature compensation circuit 308. The buffered logarithmically amplified voltage may be presented to the temperature compensation circuit 308 through the sixth and seventh output terminals 334, 336 of the buffer amplifier 306.

The temperature compensation circuit 308 may include an eighth output terminal 354, a third current source 356, and seventh, eighth, ninth, tenth, eleventh, twelfth, thirteenth, and fourteenth transistors 358, 360, 362, 364, 366, 368, 370, 372.

In some embodiments, the eighth output terminal 354 may correspond to the sample node 128 of FIGS. 1 and 2. The eighth output terminal 354 may be coupled between a fifth resistor 374 and a fourth current source 376 and may be coupled between drain terminals of the eighth and fourteenth transistors 360, 372. The fourth current source 376 and source terminals of the seventh, eighth, ninth, and tenth transistors 358, 360, 362, 364 may be coupled to a voltage supply (not shown). The third current source 356, the fifth resistor 374, and source terminals of the thirteenth and fourteenth transistors 370, 372 may be coupled to ground. Gate terminals of the seventh and eighth transistors 358, 360 may be coupled together and may be coupled to a drain terminal of the seventh transistor 358 and a collector terminal of the eleventh transistor 366. The drain terminals of the eighth and fourteenth transistors 360, 372 may be coupled together. Gate terminals of the ninth and tenth transistors 362, 364 may be coupled together and may be coupled to a collector terminal of the twelfth transistor 368 and a drain terminal of the ninth transistor 362. The drain terminal of the ninth transistor 362 may be coupled to the collector terminal of the twelfth transistor 368. A drain terminal of the tenth transistor 364 may be coupled to a drain terminal of the thirteenth transistor 370. The base terminal of the eleventh transistor 366 may be coupled to a collector terminal of the sixth transistor 352. Emitter terminals of the eleventh and twelfth transistors 366, 368 may be coupled together and coupled to the third current source 356. The base terminal of the twelfth transistor 368 may be coupled to a collector terminal of the fifth transistor 350. Gate terminals of the thirteenth and fourteenth transistors 370, 372 may be coupled together and coupled between the drain terminals of the tenth and thirteenth transistors 364, 370.

The temperature compensation circuit 308 may be configured to apply temperature compensation to the logarithmically amplified electrical signal and to generate a temperature compensated logarithmically amplified electrical signal. The temperature compensation circuit 308 may output the temperature compensated logarithmically amplified electrical signal on the eighth output terminal 354.

The fourth current source 376 and the fifth resistor 374 may be configured to raise, lower, shift, or otherwise translate the temperature compensated logarithmically amplified electrical signal ("the signal") presented on the eighth output terminal 354. In this manner, the signal may be shifted up or down to fit within a particular resolution zone of an ADC configured to sample the signal. For example, if the fourth current source 376 outputs a current having a value of 30 µA, and the fifth resistor 374 has a resistance value of 50 KΩ, a voltage of ≈1.5 V would be created on the eighth output terminal 354 according to Ohm's Law. Thus, in this example, the signal would be shifted up by 1.5 V. However, the output current of the fourth current source 376 and the resistance value of fifth resistor 374 may be selected with any values to effect any desired signal shift.

Figure 4:
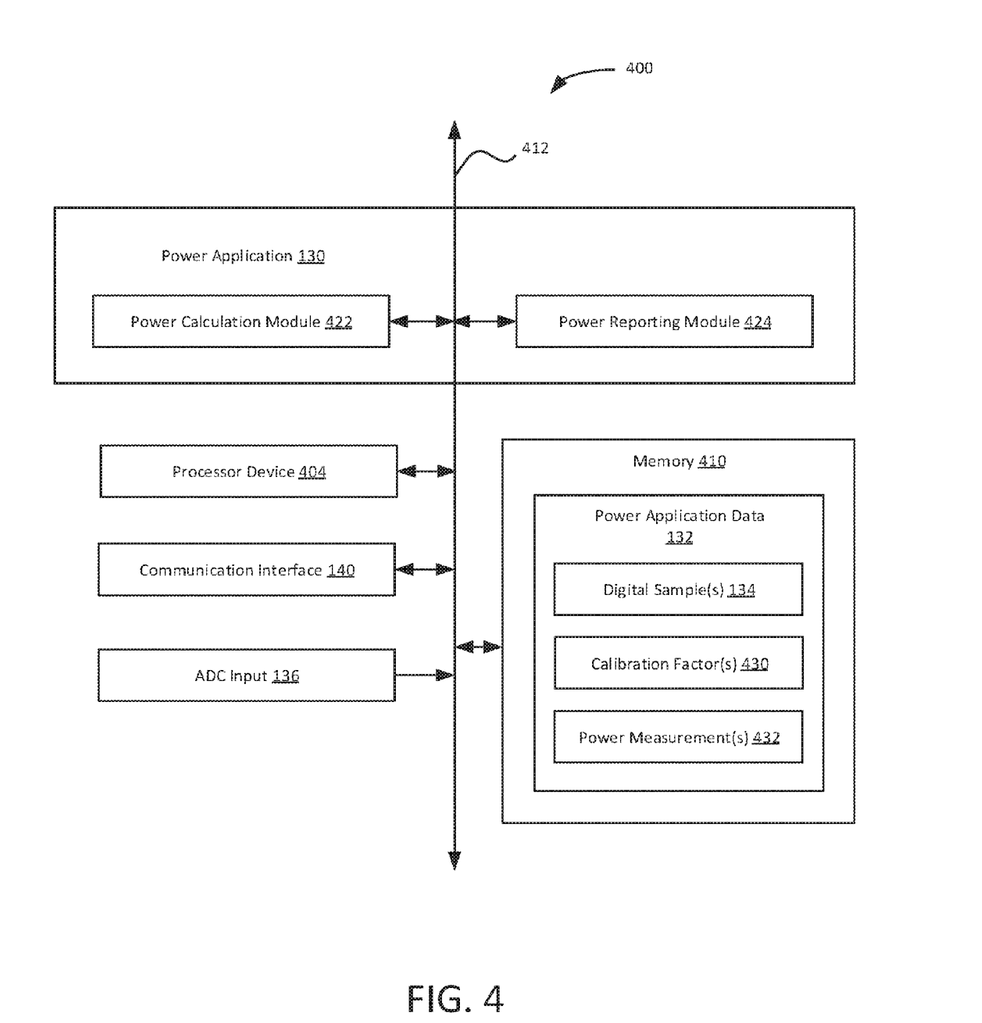
FIG. 4 is a block diagram illustrating an example controller system that may be used in the electromagnetic power measurement and reporting circuit of FIG. 1.

FIG. 4 is a block diagram illustrating an example controller system 400, arranged in accordance with at least one embodiment described herein. The controller system 400 may correspond to the controller 116 of FIG. 1 and may be implemented as a single integrated circuit on a semiconductor substrate. The controller system 400 may include the power application 130, a processor device 404, the communication interface 140, the ADC input 136, and a memory 410, according to some examples.

The power application 130 may include a power calculation module 422 and a power reporting module 424, collectively referred to herein as "modules." The power application 130, including the modules, may generally include software that includes programming code and/or computer-readable instructions executable by the processor device 404 to perform or control performance of the functions and operations described herein. The power application 130, including one or more of the modules, may receive data from another one of the components of the controller system 400 and may store the data in the memory 410.

The components of the controller system 400 may be communicatively coupled to each other by a bus 412. The bus 412 may include, but is not limited to, a memory bus, a bus/interface controller, an interface bus, or the like, or any combination thereof.

The communication interface 140 may be configured to transmit and receive data to and from other devices (not shown) through a network bus, such as an I²C serial computer bus, a universal asynchronous receiver/transmitter (UART) based network bus, or any other suitable network bus. In some implementations, the communication interface 140 may include a wireless transceiver for exchanging data with other devices or other communication channels using one or more wireless communication methods, including IEEE 802.11, IEEE 802.16, BLUETOOTH®, Wi-Fi, Zigbee, NFC, or another suitable wireless communication method.

The processor device 404 may include an arithmetic logic unit, a microprocessor, a general-purpose controller, or some other processor or array of processors, to perform or control performance of operations as described herein. The processor device 404 may be configured to process data signals and may include various computing architectures including a complex instruction set computer (CISC) architecture, a reduced instruction set computer (RISC) architecture, or an architecture implementing a combination of instruction sets. Although FIG. 4 includes a single processor device 404, multiple processor devices may be included and other processors and physical configurations may be possible. The processor device 404 may be configured to process any suitable number format including, but not limited to two's compliment numbers, integers, fixed binary point numbers, and/or floating point numbers, all of which may be signed or unsigned.

The memory 410 may include a non-transitory storage medium that stores instructions or data that may be executed or operated on by the processor device 404. The instructions or data may include programming code that may be executed by the processor device 404 to perform or control performance of the operations described herein. The memory 410 may include volatile memory, such as a dynamic random access memory (DRAM) device, a static random access memory (SRAM) device, or the like. In some implementations, the memory 410 may also include a non-volatile memory or similar permanent storage media including a flash memory device, an EEPROM, a magnetic memory device, an optical memory device, or some other mass storage for storing information on a more permanent basis. The memory 410 may store the power application data 132, such as the digital samples 134, calibration factors 430, and power measurements 432.

With combined reference to FIGS. 1 and 4, the power calculation module 422 may receive digital samples 134 from the ADC 110 through the ADC input 136 and/or may access the digital samples 134 stored in the memory 410. The power calculation module 422 may generally be configured to calibrate and calculate the power measurements 432 based on the values of the digital samples 134 and one or more calibration factors 430. In at least some embodiments, the calibration factors 430 may include linear calibration factors including a slope term and an offset term. The linear calibration factors 430 may be applied to the digital sample 134 to calibrate and calculate the power associated with the digital sample 134. An example equation for this process may include: (digital sample*slope term)+offset term=power. In some embodiments, the slope term may be approximately linear with units of dB/count and the offset term may have units of dBm. However, other calibration factors 430 may be used including, but not limited to, $n^{th}$ order polynomial, exponential, logarithmic, table lookup, or any other calibration factors or calibration math may be used. The calibration factors 430 may be determined during a production and/or calibration process and may be stored in the memory 410 as the calibration factors 430. The calibration factors 430 may be stored in any numerical form, including, but not limited to, integers, fixed binary point numbers, floating point numbers, two's compliment numbers, etc., all of which may include signed or unsigned number formatting.

The power reporting module 424 may generally be configured to format and report the power measurements 432. In some embodiments, the power reporting module 424 may be configured to format and report the power measurements 432 in units of microwatts. In these and other embodiments, the power reporting module 424 may format and report the power measurements 432 in units of microwatts on a standard scale using a 16-bit unsigned binary number. This 16-bit unsigned binary number may have a range corresponding from 0 to 6.5535 mW with an incremental value (or least significant bit value) of 0.1 microwatts per count. This standard scale is usually sufficient for power measurement circuits utilizing PIN photodiodes with typical power detection capabilities ranging from 0 dBm down to about −20 dBm. However, power measurement circuits utilizing avalanche photodiodes may have power detection capabilities ranging from 0 dBm down to about −40 dBm and lower. A −40 dBm signal corresponds to a power of 0.1 microwatts, or a single count on the standard scale. Likewise, a −37 dBm signal corresponds to a count of two on the standard scale, offering only 3 dBm of incremental resolution. A signal below −40 dBm may not be represented with the standard scale because any signal below 0.1 microwatts represents a count of zero on the standard scale.

Accordingly, in some embodiments the power reporting module 424 may be configured to format and report the power measurements 432 in units of dBm with an improved scale. In a particular embodiment, the power reporting module 424 may format and report the power measurements 432 in units of dBm using a 16-bit signed fixed point binary number in two's compliment format. The 16-bit signed fixed point binary number may have a range of ≈−128.000 dBm to ≈+128.000 dBm with a fractional resolution of 1/256 or ≈0.00391 dBm per count. The most significant bit of the 16-bit number may represent the sign of the dBm value, which may be zero for positive dBm values and one for negative dBm values. The next seven most significant bits of the 16-bit number may correspond to the integer portion of the dBm value to the left of the decimal point and may range from 0 to 128. The eight least significant bits of the 16-bit number may correspond to the fractional portion of the dBm value to the right of the decimal point and may range from ≈0.000 to 0.996 dBm. This improved scale and reporting method may represent power measurements below −40 dBm, which may not be represented on the standard scale.

In some embodiments, the power reporting module 424 may be configured to include one or more format indication flags (not shown) to indicate which format, scale, and/or reporting method the power reporting module 424 is configured to utilize. In one example, the one or more indication flags may comprise one, two, or more bits of a binary number configured to indicate which format, scale, and/or reporting method in which the power reporting module 424 is operating. In some embodiments, the power reporting module 424 may include sufficient circuitry and software to simultaneously perform power measurement formatting and reporting in both the standard scale and the improved scale. In these and other embodiments, the one or more indication flags may not be necessary.

Figure 5A:
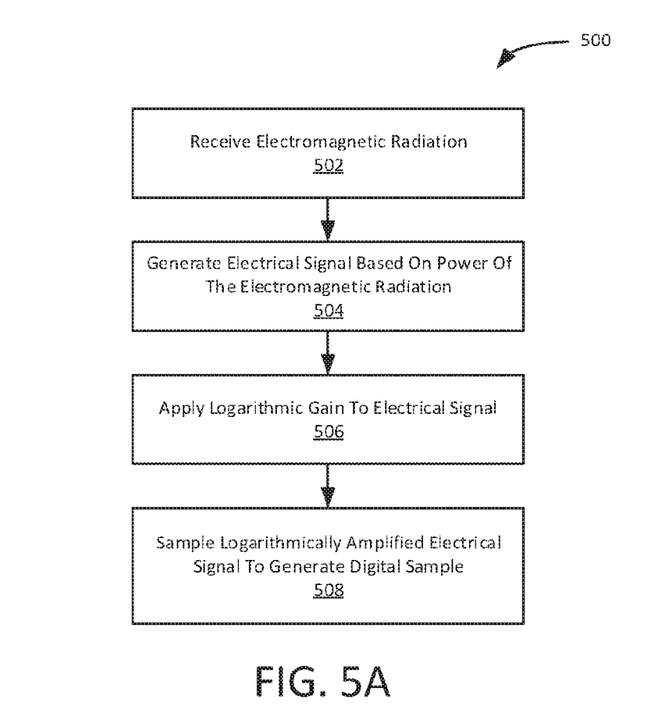
FIG. 5A is a flow diagram of an example method to logarithmically amplify and sample an electrical signal that may be implemented by the circuits of FIGS. 1-3.

FIG. 5A is a flow diagram of an example method 500 to logarithmically amplify and sample an electrical signal based on the power of the received electromagnetic radiation, arranged in accordance with at least one implementation described herein. The method 500 may be implemented, in whole or in part, by one or more of the circuit 100 of FIG. 1, the circuit 200 of FIG. 2, the circuit 300 of FIG. 3, or another suitable circuit. The method 500 may begin at block 502.

In block 502 ("Receive Electromagnetic Radiation"), electromagnetic radiation having a power may be received for analysis and measurement. Block 502 may be followed by block 504.

In block 504 ("Generate Electrical Signal Based On Power Of The Electromagnetic Radiation"), an electrical signal may be generated in response to the received electromagnetic radiation. A magnitude of the electrical signal may be based on the power of the electromagnetic radiation. The magnitude of the electrical signal may include its voltage or current, for instance. Block 504 may be followed by block 506.

In block 506 ("Apply Logarithmic Gain To Electrical Signal"), a logarithmic gain may be applied to the electrical signal to generate a logarithmically amplified electrical signal. Block 506 may be followed by block 508.

In block 508 ("Sample Logarithmically Amplified Electrical Signal To Generate Digital Sample"), the logarithmically amplified electrical signal may be sampled to generate a digital sample of the logarithmically amplified electrical signal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed implementations.

Figure 5B:
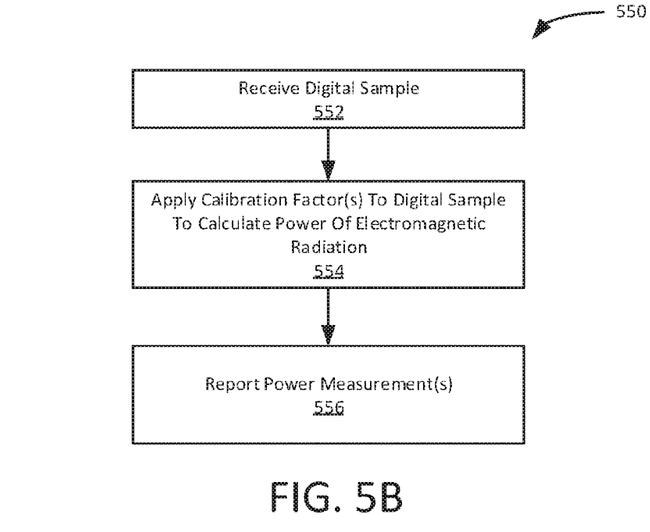
FIG. 5B is a flow diagram of an example method to format and report optical power measurements that may be implemented by the controller system of FIG. 4.

FIG. 5B is a flow diagram of an example method 550 to format and report power measurements, arranged in accordance with at least one embodiment described herein. The method 550 may be implemented, in whole or in part, by one or more of the controller 116 of FIG. 1, the controller system 400 of FIG. 4, or another suitable device and/or system. The method 550 may begin at block 552.

In block 552 ("Receive Digital Sample"), a digital sample may be received and used to calculate the power of electromagnetic radiation. The digital sample may include a digital number representing a measurement associated with the power of electromagnetic radiation. Block 502 may be followed by block 504.

In block 554 ("Apply Calibration Factor(s) To Digital Sample To Calculate Power Of Electromagnetic Radiation"), one or more calibration factor(s) may be applied to the digital sample in order to calculate the power of the electromagnetic radiation.

In block 556 ("Report Power Measurement(s)"), power measurements may be formatted and reported based on the identified format indication flag(s). For example, power measurements may be formatted and reported in units of microwatts on a standard scale using a 16-bit unsigned binary number. This 16-bit unsigned binary number may have a range corresponding from 0 to 6.5535 mW with an incremental value (or least significant bit value) of 0.1 microwatts per count. Alternatively, or in addition thereto, power measurements may be formatted and reported in units of dBm on an improved scale using a 16-bit signed fixed point binary number in twos compliment format. This 16-bit signed fixed point binary number may have a range of $\approx$-128.000 dBm to $\approx$+128.000 dBm with a fractional resolution of $1/256$ or $\approx$0.00391 dBm per count.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

The implementations described herein may include the use of a special purpose or general-purpose computer including various computer hardware or software modules, as discussed in greater detail below.

Embodiments within the scope of the technology disclosed herein may also include computer-readable media for carrying or having computer-executable instructions or data structures stored thereon. Such computer-readable media may be any available media that may be accessed by a general purpose or special purpose computer. By way of example, and not limitation, such computer-readable media may comprise RAM, ROM, EEPROM, CD-ROM or other optical disk storage, magnetic disk storage or other magnetic storage devices, or any other non-transitory medium which may be used to carry or store desired program code means in the form of computer-executable instructions or data structures and which may be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above may also be included within the scope of computer-readable media.

Computer-executable instructions comprise, for example, instructions and data, which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" will be interpreted as "including but not limited to," the term "having" will be interpreted as "having at least," the term "includes" will be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases will not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" will be interpreted to mean "at least one" or "one or more"); the same holds true for the use of definite articles used to introduce claim recitations. In addition, even if a specific number of an introduced claim recitation is explicitly recited, those skilled in the art will recognize that such recitation will be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, will be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," and the like include the number recited and refer to ranges, which may be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

The present disclosure is not to be limited in terms of the particular embodiments described herein, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which may, of course, vary. It is also to be understood that the terminology used herein is for the purpose of describing particular embodiments only, and is not intended to be limiting. Accordingly, the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed is:

1. A method, comprising:
   receiving electromagnetic radiation;
   generating a first electrical signal in response to the received electromagnetic radiation, a magnitude of the first electrical signal based on a power of the electromagnetic radiation;
   generating a second electrical signal based on the magnitude of the first electrical signal;
   applying a logarithmic gain to the second electrical signal to generate a logarithmically amplified electrical signal; and
   sampling the logarithmically amplified electrical signal to generate a digital sample of the logarithmically amplified electrical signal.

2. The method of claim 1, wherein the generating the second electrical signal comprises generating the second electrical signal at a precision current mirror circuit.

3. The method of claim 2, wherein the first second electrical signal comprises a mirrored current of the first electrical signal.

4. The method of claim 3, wherein the generating the first electrical signal in response to the received electromagnetic radiation comprises generating the first electrical signal at a photodiode.

5. The method of claim 1, further comprising compressing the logarithmically amplified electrical signal such that a dynamic range of the compressed logarithmically amplified electrical signal fits within a particular resolution zone of an analog to digital converter configured to sample the logarithmically amplified electrical signal to generate the digital sample.

6. The method of claim 5, further comprising applying temperature compensation to the compressed logarithmically amplified electrical signal to generate a temperature compensated logarithmically amplified electrical signal.

7. The method of claim 1, further comprising:
   receiving the digital sample; and
   calculating the power of the electromagnetic radiation by applying one or more calibration factors to the digital sample.

8. The method of claim 7, wherein the one or more calibration factors comprises a slope term and an offset term.

9. The method of claim 7, wherein the one or more calibration factors comprise at least one of an exponential function, a polynomial function, or a logarithmic function.

10. The method of claim 7, wherein the one or more calibration factors are arranged in a look-up table.

11. The method of claim 7, wherein the power of the electromagnetic radiation is formatted and reported in units of Decibel-milliwatts (dBm) utilizing a scale that ranges from approximately +128.000 dBm to −128.000 dBm.

12. The method of claim 1, wherein the logarithmic gain has a slope ranging from about twenty four to about twenty seven millivolts per Decibel (dB).

13. A system, comprising:
   a photodiode configured to receive electromagnetic radiation and generate a first electrical signal in response to the received electromagnetic radiation, a magnitude of the first electrical signal based on a power of the electromagnetic radiation;

a circuit electrically coupled to the photodiode and configured to generate a second electrical signal based on the magnitude of the first electrical signal;

a logarithmic amplifier electrically coupled to the circuit and configured to apply a logarithmic gain to the second electrical signal to generate a logarithmically amplified electrical signal; and an analog-to-digital converter electrically coupled to the logarithmic amplifier and configured to sample the logarithmically amplified signal and generate a digital sample.

14. The system of claim 13, wherein the circuit comprises a precision current mirror circuit.

15. The system of claim 13, wherein the photodiode comprises an avalanche photodiode.

16. The system of claim 13, further comprising a buffer amplifier circuit electrically coupled between the logarithmic amplifier and the analog-to-digital converter and configured to compress the logarithmically amplified electrical signal such that a dynamic range of the compressed logarithmically amplified electrical signal fits within a particular resolution zone of the analog to digital converter.

17. The system of claim 16, further comprising a temperature compensation circuit electrically coupled between the buffer amplifier circuit and the analog-to-digital converter and configured to apply temperature compensation to the compressed logarithmically amplified electrical signal to generate a temperature compensated logarithmically amplified electrical signal.

18. The system of claim 13, further comprising a power calculation module communicatively coupled to the analog-to-digital converter, the power calculation module configured to:

receive the digital sample; and calculate the power of the electromagnetic radiation by applying one or more calibration factors to the digital sample.

19. The system of claim 18, wherein the one or more calibration factors comprise a slope term and an offset term.

20. The system of claim 18, wherein the power of the electromagnetic radiation is formatted and reported in units of Decibel-milliwatts (dBm) utilizing a scale that ranges from approximately +128.000 dBm to −128.000 dBm.

* * * * *